United States Patent [19]
Pathak et al.

[11] Patent Number: 5,272,674
[45] Date of Patent: Dec. 21, 1993

[54] HIGH SPEED MEMORY SENSE AMPLIFIER WITH NOISE REDUCTION

[75] Inventors: Saroj Pathak, Los Altos Hills; Glen A. Rosendale, Santa Clara, both of Calif.

[73] Assignee: Atmel Corporation, San Jose, Calif.

[21] Appl. No.: 948,481

[22] Filed: Sep. 21, 1992

[51] Int. Cl.$^5$ .................................................. G11C 7/00
[52] U.S. Cl. ........................................ 365/206; 365/207; 365/208; 307/542
[58] Field of Search ................ 365/206, 207, 208; 307/530, 542; 328/162, 165

[56] References Cited

U.S. PATENT DOCUMENTS

| | | | |
|---|---|---|---|
| 4,827,454 | 5/1989 | Okazaki | 365/206 |
| 4,959,816 | 9/1990 | Iwahashi et al. | 365/233.5 |
| 4,982,366 | 1/1991 | Takemae | 365/189.05 |
| 5,200,926 | 4/1993 | Iwahashi et al. | 365/233.5 |

Primary Examiner—Eugene R. LaRoche
Assistant Examiner—Andrew Tran
Attorney, Agent, or Firm—Schneck & McHugh

[57] ABSTRACT

A read circuit for a semiconductor memory that includes a pass transistor between the output of a first sense amplifier reading the memory and a latch. The pass transistor blocks transmission of the sense amplifier's output to the latch whenever a noise glitch producing condition is sensed. A second sense amplifier connected through the same conductive line to the memory cell array as the first sense amplifier has a faster response and lower current threshold in order to detect the glitch producing condition. A pulse generator receives the output of the second sense amplifier and provides a control signal pulse of predetermined duration following detection of the glitch producing condition by the second sense amplifier. The pulse is received by a control gate of the pass transistor, turning the transistor off during the duration of the pulse.

8 Claims, 5 Drawing Sheets

HIGH SPEED MEMORY SENSE AMPLIFIER WITH NOISE REDUCTION

TECHNICAL FIELD

The present invention relates to data read circuitry for semiconductor memory, and in particular to sense amplifiers and associated circuit elements in the read circuitry that are specially adapted to reduce noise in the output signal representing data retrieved from the memory.

BACKGROUND ART

A typical semiconductor memory, shown in FIG. 1, includes a matrix of memory cells 11 arranged in rows and columns. Each memory cell 11 may be a single, variable threshold, floating gate device, such as an EPROM or EEPROM device, with its source and drain terminals connected between a column line 13 and ground and with its control gate connected to a row line 15. Row select signals X1, X2, etc. are applied to respective row lines 15 in order to apply an active voltage level to the control gates of, and thereby enable, a selected row of memory cells 11. Pass transistors 17 are connected at the end of each column line 13. Column select signals Y1, Y2, etc. are applied to respective gates of pass transistors 17 in order to enable a pass transistor 17 in a selected column, and thereby connect the selected column line 13 and associated memory cells 11 to a sense amplifier 19 via a conductive line 21. A sense amplifier 19 typically includes a first circuit portion 23 for sensing a small amount of current i on the conductive line 21 and producing a voltage level on an output 25 of the current sensing circuit portion 23 of sense amplifier 19 corresponding to the amount of current i that is sensed. Sense amplifier 19 typically also includes a second circuit portion 27 connected to the output 25 of the current sensing circuit portion 23 for producing a first voltage level on output line 29 whenever the voltage level on line 25 drops below a threshold voltage (i.e., when the current i exceeds a threshold current) and producing a second voltage level on output line 29 whenever the voltage level on line 25 is above the threshold voltage (i.e., when the current i is less than the threshold current). For example, a CMOS inverter with an unbalanced threshold (e.g., an inverter with a significantly wider n-channel transistor) could be used for the amplifying circuit portion 27 of the sense amplifier 19. An additional inverter could be included to reinvert the output.

The operation of the memory circuit in FIG. 1 consists of successive selections by the row and column select signals X1, X2, etc., Y1, Y2, etc., of individual memory cells 11 in the specified row and column locations containing stored bits of information to be retrieved. Memory cells 11 that are not selected are nonconductive and effectively act as capacitors between the column lines 13 and ground. A memory cell 11 which is selected will be either conductive or nonconductive, depending on whether or not a charge has been stored by previous programming in the floating gate of the EPROM or EEPROM device that comprises that memory cell 11. Storing or erasing a charge in the floating gate alters the thresh-old voltage of the device, thereby determining whether the device will turn on or remain off when a bias voltage is applied by the corresponding row select signal X1, X2, etc. to the device's control gate.

Ideally, the only contribution to the current i on conductive line 21 leading to the sense amplifier 19 will be the cell current $i_{cell}$ through the selected memory cell 11. This situation is represented by the curve 31 in FIG. 2a, in which the current i rises to a steady state level $i_0$ when the memory cell selected at time $t_0$ begins to turn on and conduct current. The resulting output voltage generated by the sense amplifier 19 on output line 29 is represented by the curve 32 in FIG. 2a. Prior to the time $t_0$, when another, nonconductive, memory cell with no cell current (i=0) is being sensed, the output voltage is at a first voltage level $V_1$. Subsequent to the time $t_0$ when the newly selected memory cell has begun to conduct, the output voltage will begin to fall, once the current i on conductive line 21 exceeds a threshold current level. Provided the current i remains greater than the threshold current level, the output voltage will continue to fall until it reaches a second voltage level $V_2$. The effect of other transitions from one selected memory cell to another, such as from a non-conductive cell to another nonconductive cell, from a conductive cell to a nonconductive cell, and from one conductive cell to another conductive cell, upon the resulting output voltage provided by the sense amplifiers will be readily recognized by comparison with the case shown in FIG. 2a. Further, it will also be recognized that the polarity of the output could be reversed so that the second voltage level $V_2$ is greater than the first voltage level $V_1$.

The ideal situation, in which cell current $i_{cell}$ is the only significant contribution to the current i on conductive line 21, frequently does not apply. There is generally a large cell capacitance (3 to 4 pF) from the column of memory cells 11 connected to a column line 13. In contrast, there is a relatively small capacitance (0.2 to 0.3 pF) from the wiring of the structure, i.e., from the conductive lines themselves. Whenever there is a change in the selected column, as soon as the pass transistor 17 at the end of the selected column turns on, a charging current $i_{charge}$ will flow through the conductive line 21 and selected column line 13 in order to charge up the column line 13. This charging current $i_{charge}$ is present because the small capacitance from the wiring is only 5–10% of the cell capacitance and thus unable by itself to completely charge up the column line 13 with all of its memory cells 11. The sense amplifier 19 sees this momentary charging current $i_{charge}$, in addition to any cell current $i_{cell}$ from the selected memory cell 11, and will thus produce a corresponding glitch in the voltage output. This situation is illustrated in FIGS. 2b and 2c showing the current i and voltage output for the cases where the previously selected memory cell in one column is nonconductive and the newly selected memory cell in another column is, respectively, nonconductive (FIG. 2b) and conductive (FIG. 2c) when selected.

In FIG. 2b, the charging current $i_{charge}$ is the only significant contribution to the current i, represented by curve 33, on conductive line 21. Ideally, the voltage output from the sense amplifier 19, represented by curve 34, would remain at first voltage level $V_1$, since both the previously selected and newly selected memory cells are programmed to be nonconductive ($i_{cell}=0$). However, the large charging current that occurs immediately after time $t_0$ when the memory cell selection is switched exceeds the current threshold for the sense amplifier 19, causing the sense amplifier output to change to the second voltage level $V_2$. Once the charging current diminishes and drops below the current threshold level at time $t_1$, the sense amplifier output voltage returns to the first voltage level $V_1$. In FIG. 2c, both the cell current $i_{cell}$ and the charging current $i_{charge}$ contribute to the current i, represented by curve 35, on conductive line 21 sensed by the sense amplifier 19. That is, $i = i_{cell} + i_{charge}$. Ideally, the voltage output from the sense amplifier 19, represented by curve 36, would be identical to curve 32 in FIG. 2a. The voltage would change from level $V_1$ to level $V_2$ and remain there, at least until the next memory cell selection. However, when the charging current diminishes to zero at time $t_1$, the cell current $i_{cell}$ may not yet have reached the threshold current for the sense amplifier 19. A momentary spike 37 is produced in the voltage output until the threshold current is reached.

The glitches in the output voltage caused by the charging current are sufficiently large that they can easily be misinterpreted as data when the output is sent to other circuits in the system, rather than as the noise that they actually are. Further, in some types of sense amplifiers, the noise from these glitches can feed back into the sense amplifier and cause it to oscillate, thereby further increasing noise in the system.

In U.S. Pat. No. 5,056,064 Iwahashi et al. describe a semiconductor memory integrated circuit having a memory cell array with rows and columns of memory cells for storing data, address input terminals for receiving externally supplied row and column address input signals from circuits outside the memory circuit, row and column address buffers and decoders for selectively driving row lines and column selection lines in response to the address input signals received by the address input terminals, a column gate circuit for selecting a bit line to which memory cells in the memory cell array are respectively connected on the basis of a signal from the column selection lines, and a sense amplifier for detecting data stored in a memory cell on the selected bit line and driven by the selected row line corresponding to the address input signals. The memory circuit also includes a transfer control circuit connected between the sense amplifier and an output buffer circuit for receiving the detected data from the sense amplifier and controlling the transfer of this data to the output buffer circuit. Operation of the transfer control circuit is controlled by output pulse signals from a pulse signal generator. The pulse signal generator detects logic level changes of the address input signals from the address input terminals and outputs a pulse signal whenever there is a change in at least one of the address input signals. The transfer control circuit has a faster response time for quickly transferring detected data to the output buffer when the pulse signal is generated, and a slower response time for delaying transfer of signals while the pulse signal is not present in order to prevent the outputting of erroneous signals due to power source voltage variations.

An object of the invention is to provide a data retrieval circuit for a high speed semiconductor memory integrated circuit that reduces the noise in the data signal output from the memory that is seen by the rest of the system employing such memory circuits.

DISCLOSURE OF THE INVENTION

The object is met with a read circuit that includes an output latch separated from the output of a first sense amplifier by a pass transistor, a faster second sense amplifier coupled to the same conductive line leading to the memory cell array as the first sense amplifier and responsive to a smaller threshold current level, and a pulse generator connected between the second sense amplifier and the pass transistor for providing a control signal pulse of predetermined duration to turn off the pass transistor whenever the second sense amplifier sees the smaller threshold current level. Noise glitches that tend to occur most frequently during periods immediately after the selection of a new memory cell are prevented from propagating from the first sense amplifier to the latch, because the pass transistor is turned off during these time periods.

BEST MODE FOR CARRYING OUT THE INVENTION

Figure 1:
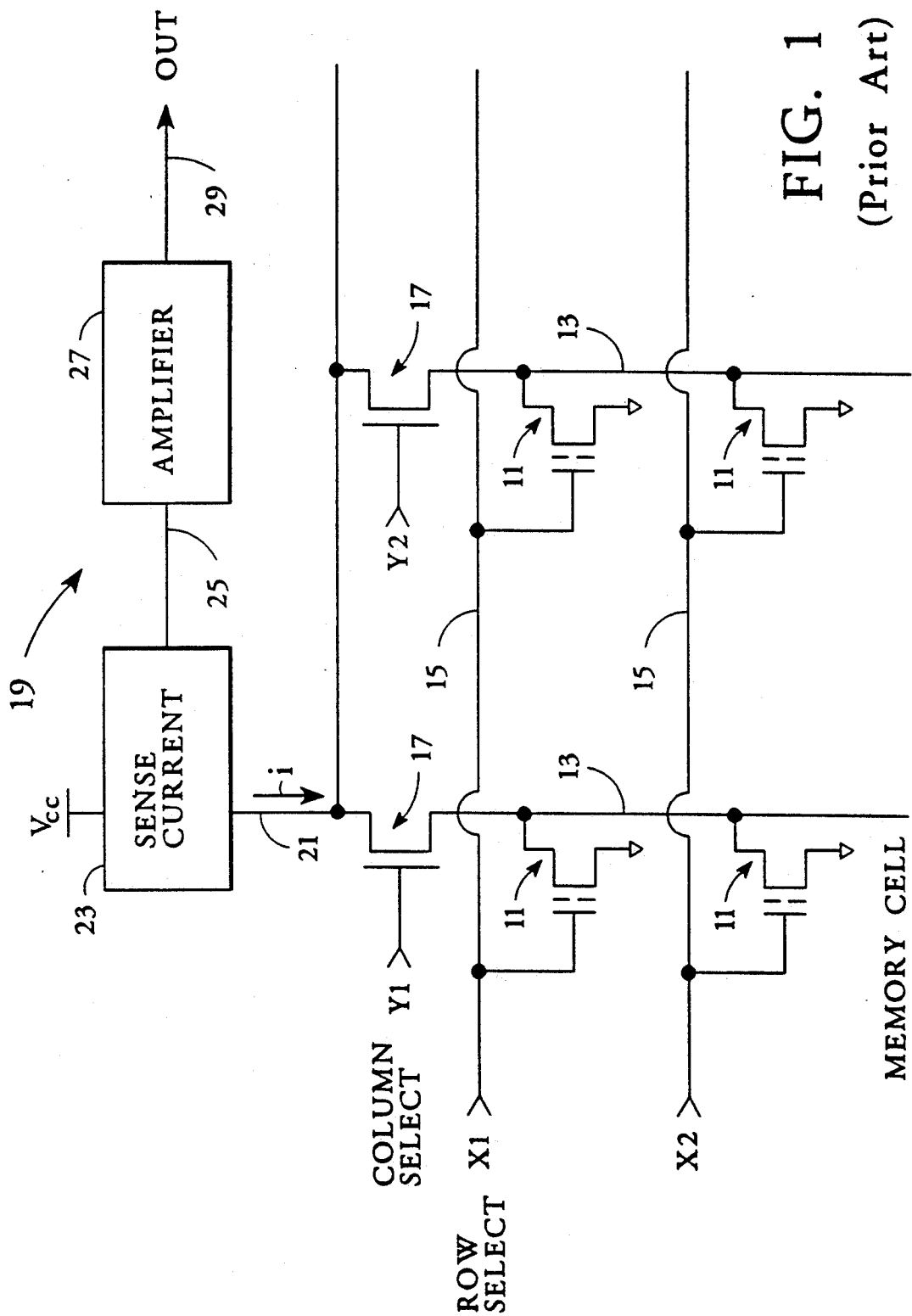
FIG. 1 is a schematic circuit diagram of a semiconductor memory with data read circuitry of the prior art.
Figure 3:
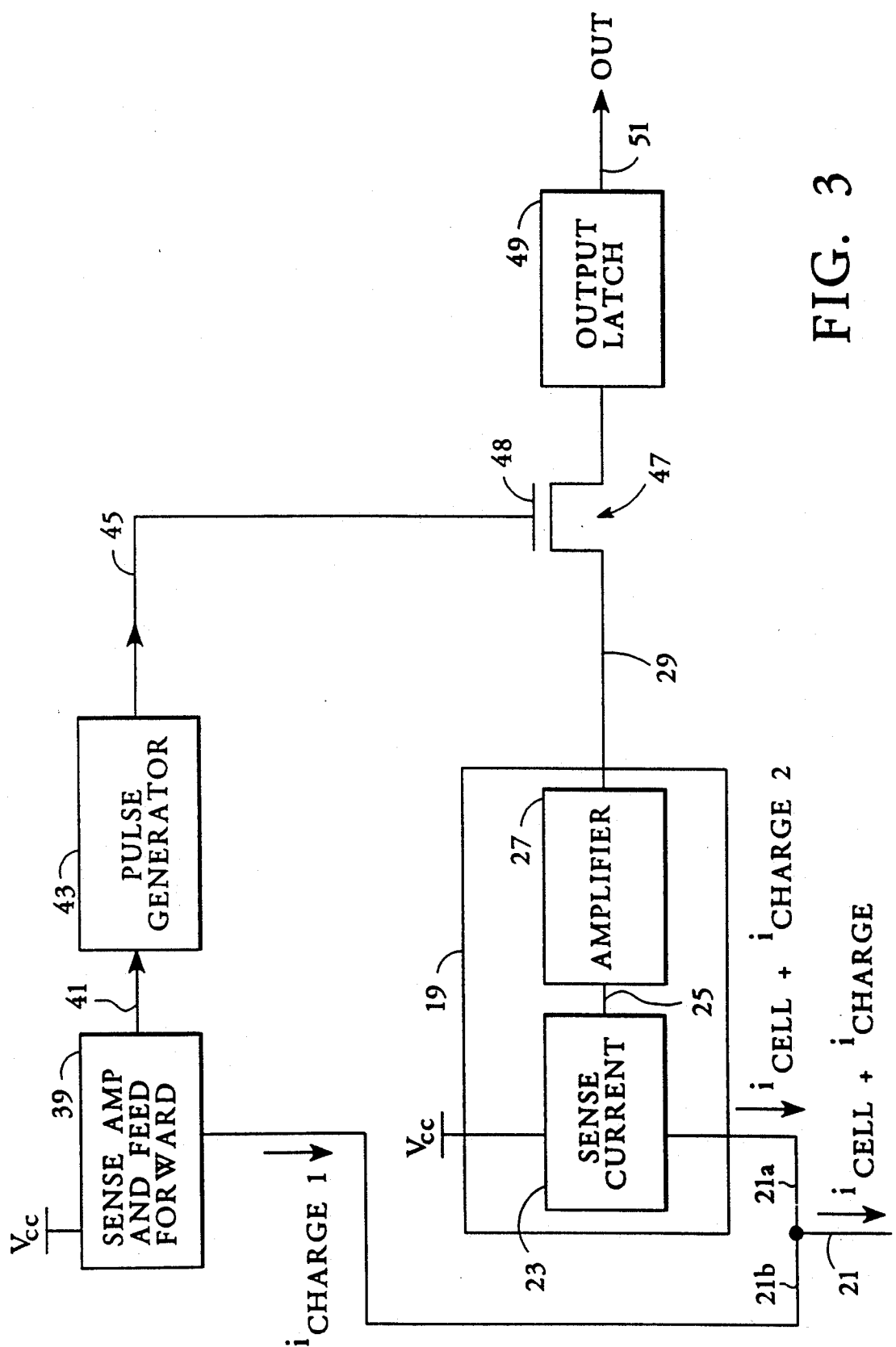
FIG. 3 is a block diagram of data read circuitry of the present invention for use in a semiconductor memory.

With reference to FIG. 3, a data read circuit of the present invention for a high speed, semiconductor memory integrated circuit includes a first sense amplifier 19 connected via a conductive line 21 and a first conductive branch line 21a to a memory cell array. The memory cell array may be a matrix of rows and columns of individual nonvolatile memory cell devices connected to row and column lines and selected by row and column address signals, like the array structure seen in FIG. 1, or it may be another known type of memory cell array. The data read circuit prevents any noise glitches that are due to the presence of any current on conductive line 21 other than that contributed by the selected memory cell from being output to other circuits in the system utilizing the memory circuit. The first sense amplifier 19 includes a first current sensing circuit portion 23 and a second voltage amplifying circuit portion 27. The current sensing portion 23 of the sense amplifier is connected to first conductive branch line 21a. Current flowing from a power supply voltage source $V_{cc}$ through the current sensing circuit portion 23 and through the first conductive branch 21a and conductive line 21 causes the current sensing circuit portion 23 to output a voltage, which is related to the amount of current flow, onto the line 25 connecting the current sensing circuit 23 to the amplifying portion 27. The amplifying portion 27 of the sense amplifier 19 provides an output voltage signal on an output line 29 which is related to the voltage it receives on the connecting line 25 from the current sensing circuit portion 23, and which, therefore, is related to the amount of current on branch line 21a. In particular, the voltage on sense amplifier output 29 is at a first voltage level whenever the current on branch line 21a exceeds a threshold current level and is at a second voltage level whenever the current on branch line 21a is below the threshold current level. The two voltage levels are typically about 0 volts and 5 volts, respectively, for CMOS circuits. So far, the discussion is identical to that for a prior art data read circuit, like that seen in FIG. 1.

The data read circuit of the present invention also includes a second sense amplifier 39 which is also connected to the conductive line 21 and memory cell array via a second conductive branch line 21b. The second sense amplifier 39 is essentially identical to the first sense amplifier 19, except that the second sense amplifier 39 is faster and responds to a lower second threshold current level on second branch line 21b in comparison to the response of the first sense amplifier 19. In particular, the second sense amplifier 39 provides a voltage on its output 41 which is at a third voltage level whenever the current on branch line 21b exceeds this second threshold current level and which is at a fourth voltage level whenever the current on branch line 21b is below that threshold current level. Typically, the third and fourth voltage levels provided by the second sense amplifier 39 are the same as the first and second voltage levels provided by the first sense amplifier 19, that is, 0 volts and 5 volts for CMOS circuits, but this is not essential.

The second sense amplifier 39 is a feedforward device that quickly responds to current on the branch line 21b and provides its voltage output, via the amplifier's output line 41, to a pulse generator 43. The pulse generator 43 provides a control signal pulse of predetermined duration on the generator's output 45 whenever a transition from the fourth voltage level to the third voltage level occurs on the output 41 of the second sense amplifier 39. A pass transistor 47, connected to the output 29 of first sense amplifier 19 and to the input of an output latch 49, has a control gate 48 connected to the output 45 of the pulse generator 43 to receive the control signal pulse. The pass transistor 47 is responsive to the control signal pulse, acting as a latch input gate or switch to prevent transfer of the output voltage from the first sense amplifier 19 to the output latch 49 for the duration of the control signal pulse, but to allow such data transfers after the end of the pulse. The latch output 51 forms the output of the read circuit, providing the latched in data to other circuits in a data system using the memory.

Figure 4:
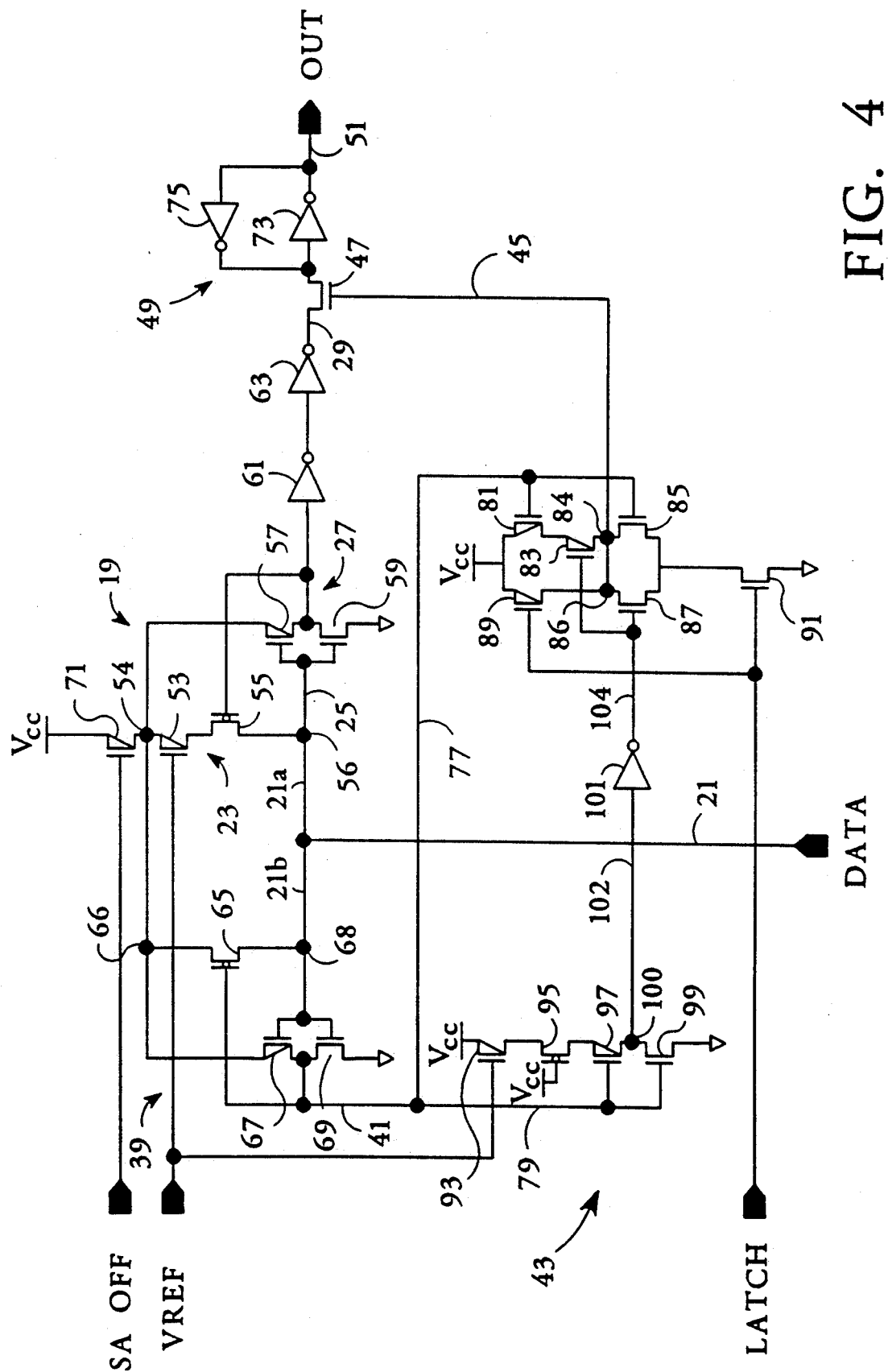
FIG. 4 is a detailed schematic circuit diagram of the data read circuitry of FIG. 3.

With reference to FIG. 4, a more detailed circuit schematic shows the preferred embodiment of a data read circuit of the present invention. The first sense amplifier 19 includes a current sensing portion 23 made up of a p-channel transistor 53 and a weak n-channel transistor 55 connected in series between nodes 54 and 56. The node 56 is connected to the first conductive branch line 21a leading to conductive line 21 and a memory cell array providing data. The first sense amplifier 19 also includes a voltage amplifying portion 27 made up of a p-channel transistor 57 and an n-channel transistor 59 connected as a CMOS inverter between node 54 and ground. The input to the inverter is a connecting line 25 to the node 56. The output to the voltage amplifying inverter connects to the gate of weak n-channel transistor 55 of the current sensing circuit portion, and also connects to a pair of additional inverters 61 and 63. The output of inverter 63 forms the output 29 of the voltage amplifying circuit portion 27 and connects to pass transistor 47. The second sense amplifier 39 likewise includes a current sensing portion, made up of a weak n-channel transistor 65 connected between nodes 66 and 68, and a voltage amplifying portion, made up of p-channel and n-channel transistors 67 and 69 connected as a CMOS inverter between node 66 and ground. The gate of the weak n-channel transistor 65 of the current sensing circuit portion is connected to the output of the voltage amplifying inverter. The input of the inverter is connected to node 68, which in turn is connected via second conductive branch line 21b to conductive line 21. Nodes 54 and 66 are coupled to the power supply voltage $V_{cc}$ (typically, about 5V) via a p-channel transistor 71 which can be shut off during inactive periods by a sense amplifier disable signal "saoff" in order to save power.

The two sense amplifiers 19 and 39 differ in that second sense amplifier 39 is faster and has a lower threshold current than the first sense amplifier 19. These differences are embodied in the sizes, i.e., the width and length, of the transistor channels. Typical width/length channel dimensions (in micrometers) are 6.5/3.0 for the weak n-channel transistors 55 and 65 of both sense amplifiers, 7.0/1.5 for the p-channel transistors 57 and 67 of both sense amplifiers, 30.0/1.5 for the n-channel transistor 59 of first sense amplifier 19, 36.0/1.5 for the n-channel transistor 69 of the second sense amplifier 39, and 10.0/2.0 for p-channel transistor 53 for the first sense amplifier 19. The transistor 53 has its control gate connected to receive a reference voltage "$V_{ref}$", which is typically about 2 volts. The transistor 71 receiving the sense amplifier disable signal "saoff" has channel width/length dimensions of 60.0/1.0 micrometers for very high conductance when transistor 71 is on (saoff=0).

The output 29 of first sense amplifier 19 is coupled through pass transistor 47 to a latch 49. Latch 49 may consist of a pair of CMOS inverters 73 and 75 with the output of each connected to the input of the other. The latch output 51 forms the output of the data read circuit. The latch 49 is gated by the pass transistor 47, which in turn is turned on or off by a control signal provided to its gate on control line 45. Control line 45 is the output of pulse generator 43, which receives the output signal of second sense amplifier 39 via output line 41.

The pulse generator 43 includes a fast path 77 for quickly turning off the pass transistor 47 and a slower path 79, 102 and 104 for turning the pass transistor 47 back on again after a predetermined duration that depends upon the amount of delay provided in the slower path 79, 102 and 104. A first p-channel transistor 81, a second p-channel transistor 83, a first n-channel transistor 85 and a second n-channel transistor 91 are connected in series between a power supply voltage $V_{cc}$ and ground. A third p-channel transistor 89, a third n-channel transistor 87 and the second n-channel transistor 91 are also connected between the power supply voltage $V_{cc}$ and ground. The gates of first p-channel transistor 81 and first n-channel transistor 85 are connected to the conductive line 77 for the fast path. The gates of the second p-channel transistor 83 and the third n-channel transistor 87 are connected to the conductive line 104 for the slow path. The gates of the third p-channel transistor 89 and the second n-channel transistor 91 are connected to receive a latch control enable signal "latch". When this latch control enable signal is high, the pass transistor 47 can be enabled and disabled in accord with the invention. When the latch control enable signal is low, the pass transistor 47 is always on, because the control line 45 is isolated from ground, due to the transistor 91 being off, and coupled to the power supply voltage, due to the transistor 89 being on. This allows users to disable the glitch propagation prevent feature of the present invention, if desired. When the invention is enabled (latch =high), a logic high signal on fast path 77, turns on transistor 85 and turns off transistor 81, coupling the node 84 and the control line 45 to ground and turning off the pass transistor 47. The control line 45 will remain at low voltage and the pass transistor 47 will remain off, even after the signal on fast path 77 goes low, because the transistor 83 is initially off, isolating the node 84 from the power supply voltage $V_{cc}$. After a predetermined duration, a logic low signal will arrive on the conductive line 104 of the slow path, turning on the transistor 83 and pulling up the control line 45 at node 84. This turns the pass transistor 47 back on, allowing the sensed data at output 29 to be coupled into latch 49.

The slow signal path 79, 102 and 104 includes a first p-channel transistor 93, a weak n-channel transistor 95, a second p-channel transistor 97 and an n-channel transistor 99, all connected in series between a power supply voltage $V_{cc}$ and ground. The conductive line 79 of the slow path connects to the gates of the second p-channel transistor 97 and the n-channel transistor 99. The gate of the weak n-channel transistor 95 is connected to the power supply voltage $V_{cc}$ and the gate of the first p-channel transistor 93 is connected to receive a reference voltage "$V_{ref}$", which is typically about 2 volts. A node 100 between the p-channel and n-channel transistors 97 and 99 connects via the conductive line 102 of the slow path to a delay buffer 101, which in turn provides an output signal onto conductive line 104. The delay provided on the slow signal path and thus the duration for which the pass transistor 47 is turned off, depends principally upon the channel dimensions of the transistors 93, 95, 97 and 99. Typical width/length dimensions (in micrometers) are 3.0/2.5 for the first p-channel transistor 93, 6.5/3.0 for the weak n-channel transistor 95, 3.0/1.0 for the second p-channel transistor 97 and 12.0/1.0 for the n-channel transistor 99.

Figure 2B:
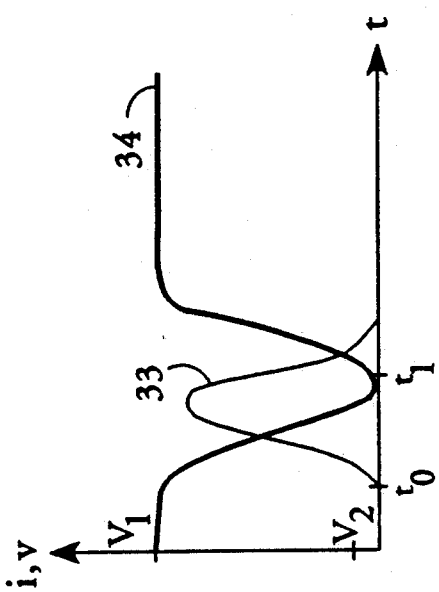
FIGS. 2a–2c are graphs of current i and output voltage v versus time for various memory read operations of the circuit in FIG. 1.
Figure 2C:
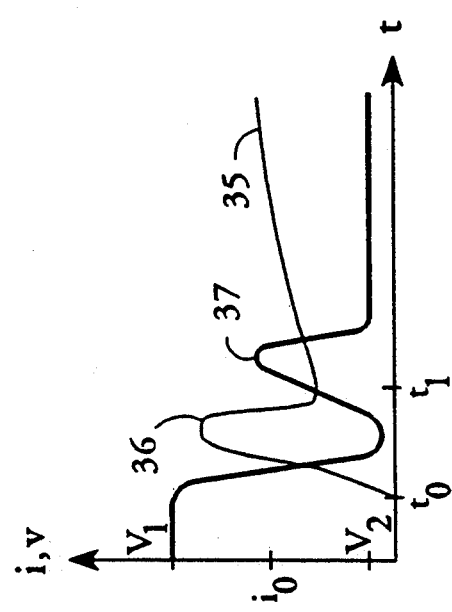
Figure 2A:
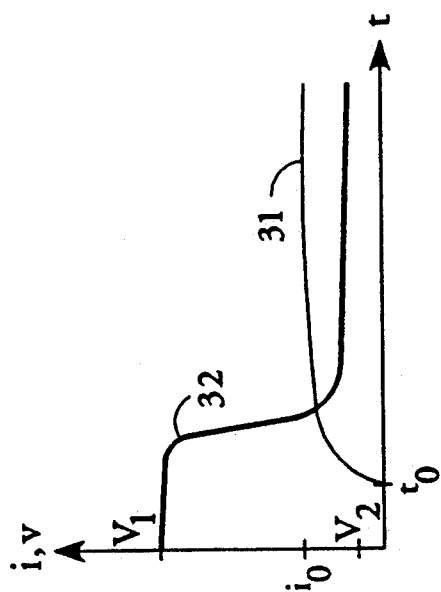
Figure 5B:
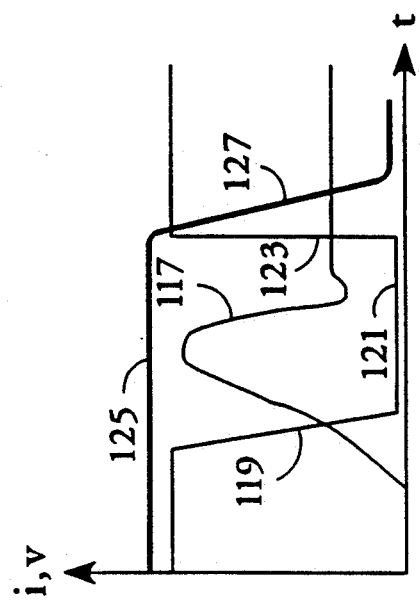
FIGS. 5a and 5b are graphs of current i, control signal voltage and output voltage v versus time for memory read operations of the circuit in FIGS. 3 and 4, analogous to the graphs in FIGS. 2b and 2c.
Figure 5A:
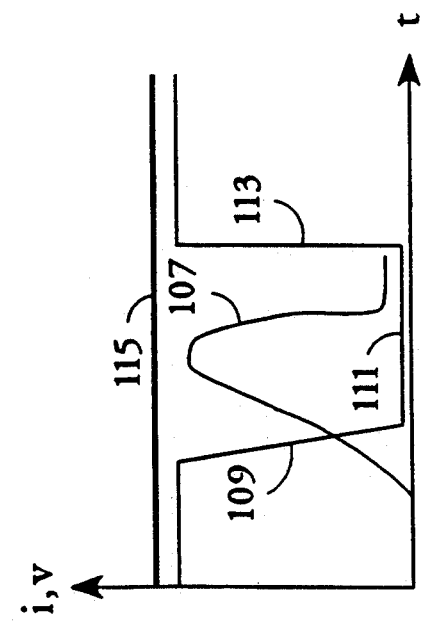

With reference to FIGS. 5a and 5b, the operation of the read circuitry described for FIGS. 3 and 4 substantially reduces the occurrence of noise glitches on the output 51. In FIG. 5a, the curve 107 represents the current on conductive line 21 in FIGS. 3 and 4 according to the same situation discussed above for FIG. 2b. In other words, the current is due solely to a charging current, the cell current being zero both before and after the latest memory cell selection. The output of pulse generator 43 on pass transistor control line 45 shows a control signal pulse with a falling edge 109 as soon as current is sensed by the second sense amplifier, a constant low voltage value at 111 for a predetermined duration which ends after the charging current has dropped to zero, or at least below a threshold value, and a rising edge 113 at the end of the predetermined duration. Because the effect of the charging current represented by curve 107 is within the time period of the control signal pulse, when the pass transistor 47 in FIG. 3 and 4 is off, the output 51 of the read circuit is steady, as seen by the curve 115 in FIG. 5a. In FIG. 5b, the situation is comparable to that described for FIG. 2c. The current on conductive line 21, represented by the curve 117, is due to both a charging current and a cell current. Again a control signal pulse is generated as the current is sensed, as seen by the falling edge 119. The control signal pulse remains at a constant low voltage value 121 for a predetermined duration. After the charging current contribution has dropped to zero and a steady current state has been reached, the control signal pulse ends, as seen by the rising edge 123. The output 51 of the read circuit sees a high voltage level 125 until the end of the control signal pulse and then falls to a low voltage level after the control signal pulse ends, as seen by the falling edge 127 of the output signal. Thus, glitches that would otherwise be output are prevented from being transferred into the latch during the time period defined by the control signal pulse.

We claim:

1. A data read circuit for a semiconductor memory comprising means for reading stored data bits from selected memory cells of said semiconductor memory and producing an output signal, said reading means including a first sense amplifier responsive to an electric current on a conductive line coupled to said memory cells and connected to said first sense amplifier, said first sense amplifier producing an output signal with a voltage corresponding to a relation of said electric current to a first threshold current level.

means for sensing a noise glitch producing condition during data read operations and producing a control signal indicative of said condition, said sensing means including a second sense amplifier responsive to said electric current on said conductive line, said conductive line being connected to said second sense amplifier as well as said first sense amplifier, said second sense amplifier producing a control signal with a voltage corresponding to a relation of said electric current to a second threshold current level, said second threshold current level being less than said first threshold current level, and means responsive to said control signal for temporarily blocking transmission of said output signal from said reading means whenever said noise glitch producing condition is indicated.

2. The data read circuit of claim 1 wherein said transmission blocking means comprises a pass transistor with a control gate connected to receive said control signal, said control signal being such as to turn said pass transistor off when indicating said noise glitch producing condition.

3. The data read circuit of claim 1 further comprising latch means coupled through said transmission blocking means to said reading means for storing the most recently received output signal and providing said stored signal as an output.

4. A read circuit for retrieving bits of information stored in memory cells of a semiconductor memory, said read circuit comprising first sense amplifier means, connected to a conductive line with at least one memory cell coupled thereto and responsive to a first electric current level, for providing a first voltage level output whenever electric current on said conductive line exceeds said first electric current level and providing a second voltage level output whenever electric current on said conductive line is less than said first electric current level, output latch means, having an input coupled to the output of said first sense amplifier and having an output forming the output of the read circuit, for holding the voltage level last received from the output of said first sense amplifier, second sense amplifier means, connected to said conductive line and responsive to a second electric current level, for providing a third voltage level output whenever electric current on said conductive line exceeds said second electric current level and providing a fourth voltage level output whenever electric current on said conductive line is less than said second electric current level, said second electric current level being smaller than said first electric current level, control signal generating means, connected to the output of said second sense amplifier means, for providing a control signal pulse of predetermined duration whenever a transition from said fourth voltage level to said third voltage level occurs on the output of said second sense amplifier means and switching means, connected between the output of said first sense amplifier means and the input of said output latch means and having a control input connected to said control signal generating means, for preventing transfer of the voltage level output from said first sense amplifier means to said output latch means whenever said control signal pulse is provided by said control signal generating means, but allowing passage of the voltage level output through said switching means to said output latch means at all other times.

5. The read circuit of claim 4 wherein each of said first and second sense amplifier means includes a current sensing portion and a voltage amplifying portion.

6. The read circuit of claim 4 wherein said third voltage level is the same as said first voltage level and said fourth voltage level is the same as said second voltage level.

7. The read circuit of claim 6 wherein said switching means comprises an MOS pass transistor, said control input being a gate of said pass transistor.

8. The read circuit of claim 4 wherein said control signal generating means includes a first path connected to said second sense amplifier output for beginning said control signal pulse and a slow path with delay circuit therein for triggering an end of said control signal pulse, said predetermined duration of said control signal pulse corresponding to a time delay by said delay circuit in said slow path.

* * * * *

UNITED STATES PATENT AND TRADEMARK OFFICE
CERTIFICATE OF CORRECTION

PATENT NO. : 5,272,674

DATED : December 21, 1993

INVENTOR(S) : Saroj Pathak et al.

It is certified that error appears in the above-indentified patent and that said Letters Patent is hereby corrected as shown below:

On title page of item:

"[75] Inventors: Saroj Pathak, Los Altos Hills; Glen A. Rosendale, Santa Clara, both of Calif."

should read:

-- [75] Inventors: Saroj Pathak, Los Altos Hills; Glen A. Rosendale, Santa Clara; and James E. Payne, Boulder Creek, all of Calif. --.

Claim 1, column 8, line 20, "current level." should read -- current level, --.

Claim 4, column 9, line 12, "amplifier means and" should read -- amplifier means, and --.

UNITED STATES PATENT AND TRADEMARK OFFICE
CERTIFICATE OF CORRECTION

PATENT NO. : 5,272,674
DATED : December 21, 1993
INVENTOR(S) : Saroj Pathak et al.

It is certified that error appears in the above-indentified patent and that said Letters Patent is hereby corrected as shown below:

Claim 7, column 10, line 10, "The read circuit of claim 6" should read - - The read circuit of claim 4 - -.

Signed and Sealed this

Twenty-fourth Day of May, 1994

Attest:

BRUCE LEHMAN

Attesting Officer     Commissioner of Patents and Trademarks